United States Patent [19]
Bladh

[11] Patent Number: 5,402,425
[45] Date of Patent: Mar. 28, 1995

[54] PHASE LOCKING CIRCUIT FOR JITTER REDUCTION IN A DIGITAL MULTIPLEX SYSTEM

[75] Inventor: Mats A. R. Bladh, Tullinge, Sweden

[73] Assignee: Telefonaktiebolaget L M Ericsson, Stockholm, Sweden

[21] Appl. No.: 128,211

[22] Filed: Sep. 29, 1993

Related U.S. Application Data

[63] Continuation-in-part of Ser. No. 718,999, Jun. 21, 1991, abandoned.

Foreign Application Priority Data

Jul. 10, 1990 [SE] Sweden .................. 9002408

[51] Int. Cl.⁶ .............................................. H04J 3/06
[52] U.S. Cl. .................... 370/105.3; 331/17; 375/372; 375/376
[58] Field of Search ............... 370/105.3, 100.1, 98, 370/74, 84; 375/106, 111, 120, 118, 119; 331/17, 11; 455/126, 266

[56] References Cited

U.S. PATENT DOCUMENTS

| | | | |
|---|---|---|---|
| 4,129,748 | 12/1978 | Saylor | 375/120 |
| 4,580,100 | 4/1986 | Suzuki et al. | 331/17 |
| 4,704,722 | 11/1987 | Henry | 375/120 |
| 4,952,887 | 8/1990 | Ashley | 331/17 |
| 5,184,350 | 2/1993 | Dara | 370/105.3 |
| 5,200,982 | 4/1993 | Weeber | 370/105.3 |
| 5,245,636 | 9/1993 | Sari et al. | 375/118 |
| 5,267,267 | 11/1993 | Kazawa et al. | 370/105.3 |

Primary Examiner—Douglas W. Olms
Assistant Examiner—Shick Hom
Attorney, Agent, or Firm—Burns, Doane, Swecker & Mathis

[57] ABSTRACT

A digital multiplex system has a buffer, to which a bitstream arrives at one frequency and from which a bitstream is forwarded at a different frequency. The output bitstream frequency is controlled by a phase locking circuit comprising a phase comparator, a voltage controlled oscillator and a control circuit. The buffer generates control signals indicating the phase of the pulses in the incoming bitstream and the phase of the pulses forwarded therefrom. The phase comparator receives said control signals and delivers a signal representative of the mutual phase position of the pulses in the incoming and the forwarded bitstream, the signal being fed to the control circuit for automatic gain control. The control circuit controls the pulse rate of the voltage controlled oscillator, which generates clock pulses for clocking the pulses of the forwarded bitstream. The control circuit comprises a feed-back operational amplifier. Two anti-parallel coupled diode are arranged on one input of the amplifier for achieving automatic gain control, the other input of the amplifier being connected to a reference voltage.

10 Claims, 3 Drawing Sheets

PHASE LOCKING CIRCUIT FOR JITTER REDUCTION IN A DIGITAL MULTIPLEX SYSTEM

This application is a continuation-in-part application of application Ser. No. 07/718,999, filed Jun. 21, 1991, now abandoned.

TECHNICAL FIELD

The present invention relates to a phase locking circuit for jitter reduction in a digital multiplex system and for control of the transmission of data bits from a buffer store, including a feed-back operational amplifier.

PRIOR ART

In a digital multiplexer of the digital cross connect (DXC) type, there is required to perform conversions of digital bitstreams from one frequency to another. A bitstream may have a certain physical transmission rate and still perform a data transfer at a lower, effective rate, by inserting bits not containing any information in the data stream. The physical frequency of the incoming bitstream could in many cases be assumed to vary very little but instead the effective data frequency will often vary more, i.e., there is a very small physical jitter and a larger effective digital jitter inherent in the data stream. The frequency of the converted bitstream should naturally be as constant as possible but it can be allowed to have a small variation within the actual standards of acceptable jitter level. Of course, this could be handled by continuously storing very wide segments of the incoming data in a large buffer store and then transmit the stored data at the frequency required. This will necessarily be time-consuming and cause a considerable delay in the transfer of data and also be costly due to the large buffer store. A smaller buffer store can instead be used if it is provided with some efficient control means for the forwarding of data bits from the buffer. This control means may comprise a phase locked circuit or loop (PLL) and it shall lock on to frequency differences, which requires "large" gain and "large" bandwidth. When the system has been phase locked, the output data stream forwarded from the buffer shall thus have a low inherent jitter, which requires "low" gain due to digitally generated jitter in the multiplex system.

Solutions up to now have comprised the manipulation of gain and bandwidth, with accompanying problems, either with jitter or locking. In U.S. Pat. No. 4,952,887 to Ashley a phase-lock loop circuit is disclosed, which is said to have improved acquisition time and stability with respect to varying input signal strengths. The loop filter circuit comprises two diodes coupled in anti-parallel to one input of an operational amplifier. The circuit is intended to be used in an analog divider.

SUMMARY OF THE INVENTION

The object of the present invention is to provide a solution to the problem of reducing inherent jitter by phase locking in a digital multiplexer of the DXC type in a simple, cheap, space and power saving device.

This object is achieved in a network system with a circuit of the kind described above having the features set out in the appended claims.

With the circuit according to the invention low gain in a phase locked circuit is thus obtained in a very simple way, resulting in low inherent jitter in the output data stream, and at the same time high gain for a circuit that has not been locked, or has a large jitter in the input data stream.

The circuit is in particular comprised in a digital multiplex system of the kind having a buffer store, an incoming bitstream arriving to the buffer at one frequency and an output bitstream being forwarded from the buffer at a different frequency. The output bitstream frequency is controlled by a phase locking circuit comprising a phase comparator, a voltage controlled oscillator and said control circuit. The buffer has control signal outputs, on which signals are generated indicating the phase of the pulses in the incoming bitstream and the phase of the pulses forwarded from the buffer. The phase comparator receives said control signals and delivers an output signal representative of the mutual phase position of the pulses in the incoming and the forwarded bitstream. Its output signal is fed to said circuit for automatic gain control. The control circuit controls the pulse rate of the voltage controlled oscillator, which generates clock pulses for clocking the pulses of the forwarded bitstream.

In particular the buffer may be a FIFO cyclical memory where data bits are stored in a cyclically next position in relation to previously stored data bits and bits are read from the memory also in the cyclically next position in relation to previously read data bits. The buffer generates control signals indicating the times when data bits are stored in a first location in the memory and the times when data bits are read from a second location in the memory. The second location is different from the first location and preferably at a good distance from the first location, in particular separated therefrom as long as possible, that is at the diametrical place in the memory, the memory being regarded as a circle.

According to the one embodiment of the circuit according to the invention, an RC circuit is arranged before the diodes on the amplifier input to pass through frequency and phase differences, for the purpose of filtering, but to attenuate the input frequencies and input signals to the phase comparator.

According to an other advantageous embodiment of the circuit according to the invention, a series resistance is provided on the amplifier input for dimensioning purposes. This resistance is intended to limit the magnitude of the gain for an unlocked circuit, and in principle it could be included in the resistance of the above-mentioned RC circuit. However, in arranging this gain regulation resistance separately the adjustment of the gain is facilitated.

According to another advantageous embodiment of the circuit according to the invention, the amplifier is of the FET or CMOS type with a high-ohm amplifier input, so that the load from the amplifier will be low.

According to a further advantageous embodiment of the circuit according to the invention, the reference voltage for the amplifier is selected such that the operation will take place substantially in the central part of the buffer store.

BRIEF DESCRIPTION OF THE DRAWINGS

An embodiment of the circuit according to the invention, given as an illustrative example, will now be described in more detail with reference to the accompanying drawings on which.

BEST MODE FOR CARRYING OUT THE INVENTION

Figure 1:
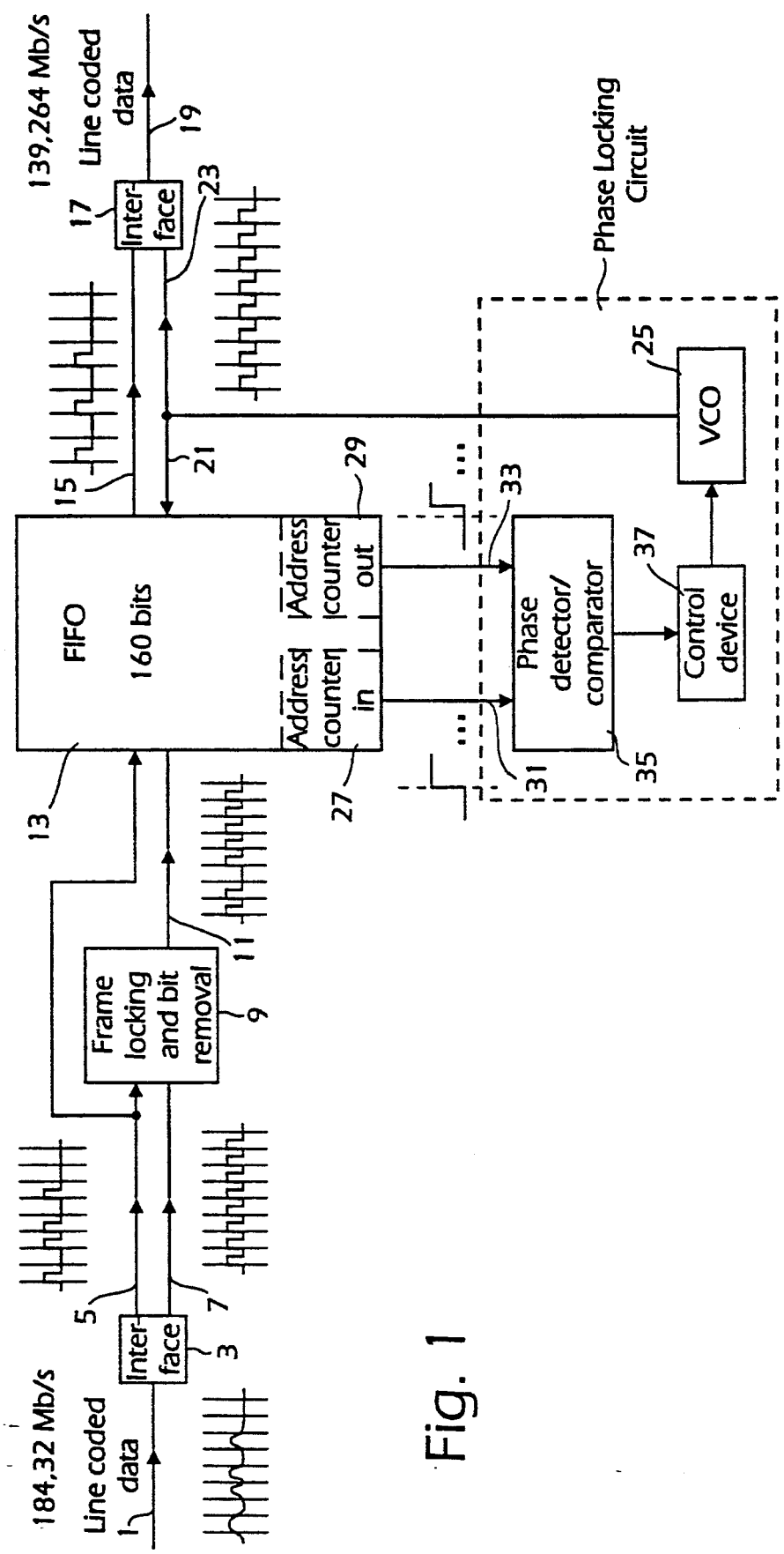
FIG. 1 illustrates a block diagram of a device for the conversion of a digital data stream to a lower frequency.

In FIG. 1 a circuit is illustrated allowing an incoming data stream to be forwarded at a lower frequency. At the input line 1 thus line coded data enters at 184,32 Mbit/s. This pulse stream is fed to an interface 3 where the pulses are given a suitable voltage level and a proper shape and forwarded on an output line 5 from the interface 3. Also a clock pulse stream is extracted from the incoming line coded data and is forwarded from the interface 3 on a line 7 in the shape of a regular square wave having the same frequency as the incoming pulse train on line 1. These two signals output from the interface 3 are fed to a device 9 for frame-locking and removal of extra superfluous bits from the data stream. In the device 9 the incoming bit stream is analyzed for establishing the frames on which the proper information is sent in said stream and thus for deciding which bits shall be removed from the data stream. The bit removal device outputs on a line 11 a reduced clock bit pulse train which coincides with the constructed clock pulses on line 7 except that some of the pulses have been removed. The average number of clock pulses will correspond to the desired output frequency from the whole circuit depicted in FIG. 1.

Figure 2:
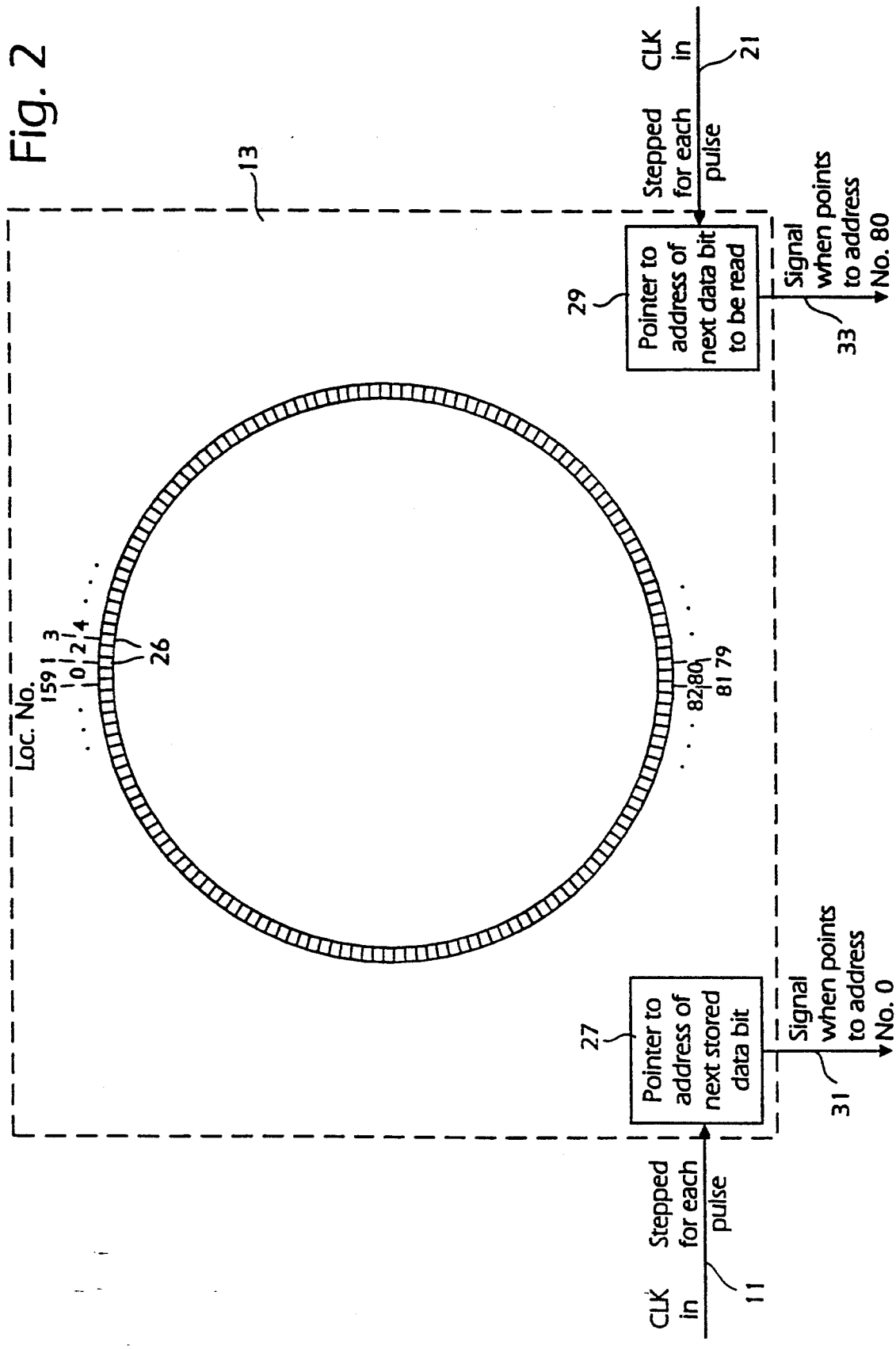
FIG. 2 illustrates the construction of a FIFO-buffer used in the device in FIG. 1.

In FIG. 2, a central unit in this circuit is a buffer, buffer store or FIFO-register 13 having a limited size, for instance as indicated allowing 160 data bits to be stored therein. The FIFO-register 13 receives the shaped pulse signal from line 5 and the reduced clock bit pulse train on line 11 from the bit removal device 99. In the FIFO-register 13 the data bits incoming from line 5 are clocked into the register and stored therein controlled by the clock bits on line 11. Thus only data bits corresponding to the pulses on line 11 are actually stored in the register 13. This will mean that possible pulses corresponding to absent pulses in the reduced clock bit pulse train on line 11 are discarded.

The FIFO-register 13 outputs on a line 15 the stored data bits sequentially and this data pulse train having a lower frequency arrives to an output interface 17, which will shape the pulses of the incoming pulse train and give them a suitable voltage level to be forwarded from the entire circuit of FIG. 1 on the output line 19, e.g., as indicated in the figure at a nominal frequency of 139,264 Mbit/s.

The velocity, with which the stored data bits are transmitted or read from the FIFO-register 13, is controlled by a pulse train on an input line 21 to the register 13. The same clock signal is also delivered to the output interface 17 on a line 23.

The output clock bit signal on lines 21 and 23 are generated by a voltage controlled oscillator (VCO) 25 comprising a suitable crystal oscillator. The voltage controlled oscillator 25 is controlled by the signal derived from two output signals from the FIFO-buffer 13.

In the FIFO-register 13 where the data storage places 26 for the transmitted data stream are located and can be considered a cyclic register, see also FIG. 2, there is an input address counter or address pointer 27 pointing to the location of the data bit which is currently being stored or is to be stored in the register 13. There is also an address counter or address pointer 29 in the same way indicating the location or address of a data bit which is forwarded or read from the buffer 13 at the output line 15. These address counters 27 and 29 are cyclically stepped each time a data bit is stored and each time a data bit is read, i.e., each time they receive a clock pulse from the lines 11 and 21 respectively. They also generate pulse signals on the lines 31 and 33 respectively, these pulses characterizing or being provided each time a specific address is used by the input address counter 27 and the output address counter 29 respectively, e.g., the input address counter provides an output pulse on the associated signal line 31 each time a data bit is stored in a buffer register 13 location having the address 0 and the output address counter 29 provides a pulse on its associated line 33 each time a data bit is read or fetched from the buffer location having the number 80 in the case when the FIFO-register 13 has 160 data bit places.

Ideally these pulses on the lines 31 and 33 would occur with a constant delay time with respect to each other, for instance arrive at exactly the same times but due to jitter in the incoming data stream this will not be true. Therefore a control is needed and thus a please locked loop (PLL) is provided comprising a phase detector or comparator 35 to which said signals are fed and the output signal of which is provided to a control device 37 controlling the above mentioned voltage controlled oscillator 25. The phase detector 35 provides a signal, the height of which indicates the amount of lacking coincidence of the pulse signals on lines 31 and 33. Preferably it can be designed to output an analogue voltage of 0 Volts when said pulses are exactly in phase, i.e., when they occur at the same time instance. Output voltages higher than 2.5 Volts from the phase detector 37 will indicate a time lead for one of the signals and voltages lower than this middle voltage indicate a lag of the same signal compared to the other one.

Figure 3:
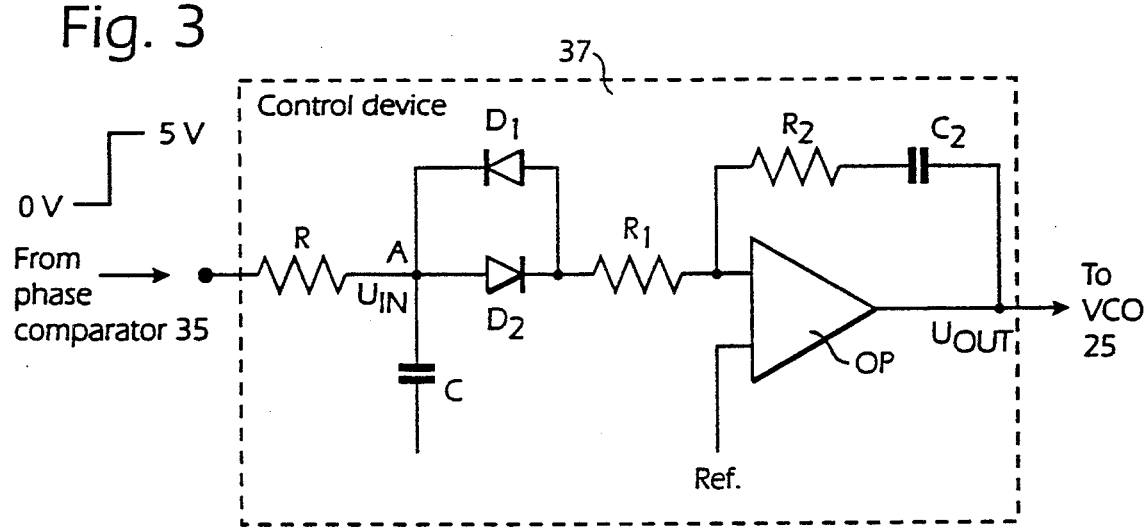
FIG. 3 is a circuit diagram of a control device used in a PLL-loop in the device of FIG. 1.

The control circuit 37 connected between the phase comparator 35 and the voltage controlled oscillator 25 is illustrated in FIG. 3. It includes an operational amplifier OP, the output signal of which is fed back by a loop $R_2$, $C_2$. $R_2$ is a resistor having a high resistance, and the capacitor $C_2$ is dimensioned to give the feed-back a long time constant (DC separation).

One input on the amplifier OP is connected to the phase comparator 35 via an RC circuit, which comprises a resistor R connected to the input and a capacitor C at point A coupled to the other terminal of the resistor R and to ground, and it is adapted to pass the signal indicating the phase difference and block fundamental frequencies from the phase comparator. There is thus obtained, at the point A in FIG. 3, a DC-signal substantially indicating the phase difference of the pulses on lines 31 and 33, FIG. 1, from the phase comparator 35, this analog DC-signal having only a low, superimposed AC level.

Two anti-parallel coupled diodes $D_1$ and $D_2$ are connected in series with a resistor $R_1$ between the point A and the input of the amplifier OP. Desired automatic gain control is thus provided in a very simple way.

The gain F will be substantially the value $$F = \frac{R_2}{R_1 + R_{D12}}$$

where $R_{D12}$ denotes a mean value of the resistance through the diodes.

For a locked PLL circuit, when the arriving signal indicates only a small phase difference, $U_{OUT}$ is constant and a small current flows through the diodes $D_1$ and $D_2$, this path then being high-ohmic, which will decrease the gain F and attenuate the jitter. For an unlocked PLL circuit a larger current passes through the diodes $D_1$ and $D_2$, this path then becoming low-ohmic, and the gain increases, so that the phase differences can be captured. There is thus obtained in a simple way the desired automatic gain control with a smooth transition between the two states, and which thus switches to low-ohm state between high and low-ohm states in response to variations in the input voltage $U_{IN}$.

The circuit includes two anti-parallel coupled diodes $D_1$ and $D_2$ such that it can operate in both directions. The diodes are suitably ordinary silicon diodes.

The resistance of the resistor $R_1$ is selected so that the gain F will have a suitable magnitude in the case when the diodes $D_1$ and $D_2$ are low-ohmic, i.e., when $R_{D12}$ is approximately equal to zero. In principle $R_1$ could be included in the input series resistor R, but the adjustment of the gain F is facilitated by the arrangement of a separate resistance $R_1$ for this purpose. The operational amplifier OP is suitably of the FET or CMOS type, with a high-ohm amplifier input, such that it conducts as small a current as possible through the diodes, thus making them high-ohmic.

As illustrated in the figure, the circuit may suitably operate at signal levels of 5 Volts, it then being suitable to choose the reference voltage Ref. coupled to the other input of the operational amplifier OP equal to 2.5 Volts, which will mean that operation will be substantially in the middle of the buffer store 13, cf. FIG. 1.

What is claimed is:

1. A digital multiplex system having a buffer, an incoming bitstream arriving to the buffer at one frequency and an output bitstream being forwarded from the buffer at a different frequency, the buffer providing control signals which indicate the phase of the pulses in the incoming bitstream and the phase of the pulses forwarded from the buffer the output bitstream frequency being controlled by a phase locking circuit comprising:
    a phase comparator, for receiving said control signal from the buffer to deliver an output signal representative of the mutual phase position of the pulses in the incoming and the forwarded bitstream;
    a control circuit, for receiving the output signal from the phase comparator, for providing automatic gain control; and
    a voltage controlled oscillator, having an input pulse rate which is controlled by the control circuit, for generating clock pulses for clocking the pulses of the forwarded bitstream;
    wherein the control circuit includes a feed-back operational amplifier, coupled between the phase comparator and the voltage controlled oscillator, the amplifier having an output and first and second inputs, the first input receiving feedback from the output and the second input being coupled to a reference voltage, and two diodes coupled anti-parallel to each other at the first input of the amplifier for achieving said automatic gain control.

2. A digital multiplex system as claimed in claim 1, wherein the control circuit further comprises an RC-circuit coupled to an input for the two diodes for only letting through phase and frequency differences detected by the phase comparator, and for filtering purposes.

3. A digital multiplex system as claimed in claim 2, wherein the control circuit further comprises a further series resistance coupled between the two diodes and the first input of the amplifier for dimensioning purposes.

4. A digital multiplex system as claimed in claim 1, wherein the amplifier in the control circuit is of the FET Or CMOS type, with high-ohmic amplifier input.

5. A digital multiplex system as claimed in claim 1, wherein the reference voltage for the amplifier is related to the operation of the buffer store.

6. A digital multiplex system, comprising:
    a buffer of a FIFO cyclical memory type, where data bits are stored in a cyclically next position in relation to previously stored data bits and bits are read from the memory also in the cyclically next position in relation to previously read data bits, the buffer having control signals, which indicate the tithes when data bits are stored in a first location in the memory and the times when data bits are being different from the first location and preferably arranged well separated from the first location, in particular at the diametrical place in the memory, the memory being regarded as a circle, the buffer having an incoming bitstream arriving to the buffer at one frequency and an output bitstream being forwarded from the buffer at a different frequency; and
    a phase locking circuit for controlling the output bitstream of the buffer, said phase locking circuit including;
        a phase comparator, for comparing the control signals from the buffer to deliver an output signal representative of the mutual position in time of the pulses in the incoming and the forwarded bitstream;
        a control circuit, for receiving the output from the phase comparator, to provide automatic gain control;
        a voltage controlled oscillator, having an input pulse rate which is controlled by the control circuit, for generating clock pulses for reading data bits from the buffer to generate the pulses of the forwarded bitstream; and
        wherein the control circuit includes a feed-back operational amplifier, coupled between the phase comparator and the voltage controlled oscillator, the amplifier having an output and first and second inputs, the first input receiving feedback from the output and the second input being coupled to a reference voltage, and two diodes coupled anti-parallel to each other at the first input of the amplifier for achieving said automatic gain control.

7. A digital multiplex system as claimed in claim 6, wherein the control circuit further comprises an RC-circuit coupled to an input for the two diodes for only letting through phase and frequency differences detected by the phase comparator, and for filtering purposes.

8. A digital multiplex system as claimed in claim 7, wherein the control circuit further comprises a further series resistance coupled between the two diodes and the first input of the amplifier for dimensioning purposes.

9. A digital multiplex system as, claimed in claim 6, wherein the amplifier in the control circuit is of the FET or CMOS type, with high-ohmic amplifier input.

10. A digital multiplex system as claimed in claim 6, wherein the reference voltage for the amplifier is related to the operation of the buffer store.

* * * * *